United States Patent
Nakano et al.

(10) Patent No.: US 6,282,779 B1
(45) Date of Patent: Sep. 4, 2001

(54) DEVICE AND METHOD FOR MOUNTING ELECTRONIC PARTS

(75) Inventors: Tomoyuki Nakano, Kofu; Naoto Mimura, Yamanashi; Hirofumi Obara, Yamanashi; Hiroshi Uchiyama, Yamanashi, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/308,362

(22) PCT Filed: Nov. 19, 1997

(86) PCT No.: PCT/JP97/04206

§ 371 Date: May 18, 1999

§ 102(e) Date: May 18, 1999

(87) PCT Pub. No.: WO98/23141

PCT Pub. Date: May 28, 1998

(30) Foreign Application Priority Data

Nov. 19, 1996 (JP) .................................................. 8-308058

(51) Int. Cl.⁷ .................................................. H05K 3/30
(52) U.S. Cl. .................................. 29/832; 29/739; 29/740; 29/743; 29/707; 29/DIG. 44; 318/135; 310/12; 901/40; 294/64.1; 414/737; 414/751.1; 414/752.1
(58) Field of Search .............................. 29/740, 743, 706, 29/707, 714, DIG. 44, 832, 840, 709, 739; 318/135; 310/12, 14; 901/40; 294/64.1; 414/737, 251.1, 752.1

(56) References Cited

U.S. PATENT DOCUMENTS

| 3,824,674 | * | 7/1974 | Inoyama et al. | 29/714 |
| 4,346,514 | * | 8/1982 | Makizawa et al. | 29/840 |
| 5,033,185 | * | 7/1991 | Hidese | 29/740 |
| 5,086,556 | * | 2/1992 | Toi | 29/740 |

FOREIGN PATENT DOCUMENTS

| 2096498 | * | 10/1982 | (GB) | 29/740 |
| 63-150186 | | 6/1988 | (JP) . | |
| 5-304395 | | 11/1993 | (JP) . | |
| 6-137969 | | 5/1994 | (JP) . | |
| 7-303000 | | 11/1995 | (JP) . | |

* cited by examiner

Primary Examiner—Lee Young
Assistant Examiner—Rick Kiltae Chang
(74) Attorney, Agent, or Firm—Wenderoth, Lind & Ponack, L.L.P.

(57) ABSTRACT

In a component mounting apparatus, a component (8) is held, positioned and mounted at a predetermined position of a member (4) to be mounted. After the component (8) is mounted to the member (4), a component holding member (5) is raised by a distance corresponding approximately to a push-in amount by which the component holding member (5) has been moved down to mount the component, then stopped to retain the component (8), is kept in this state while retaining the component for a fixed time, and is raised again to a predetermined position.

42 Claims, 9 Drawing Sheets

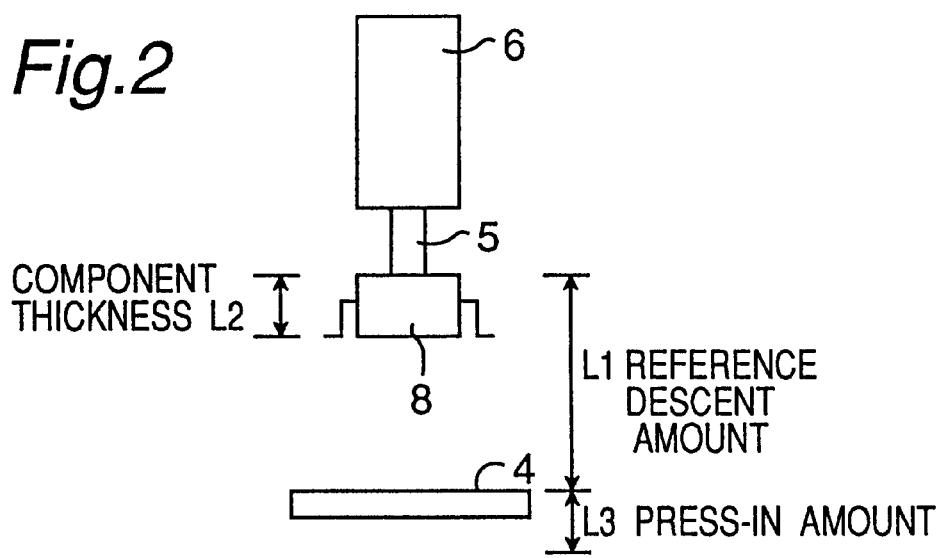
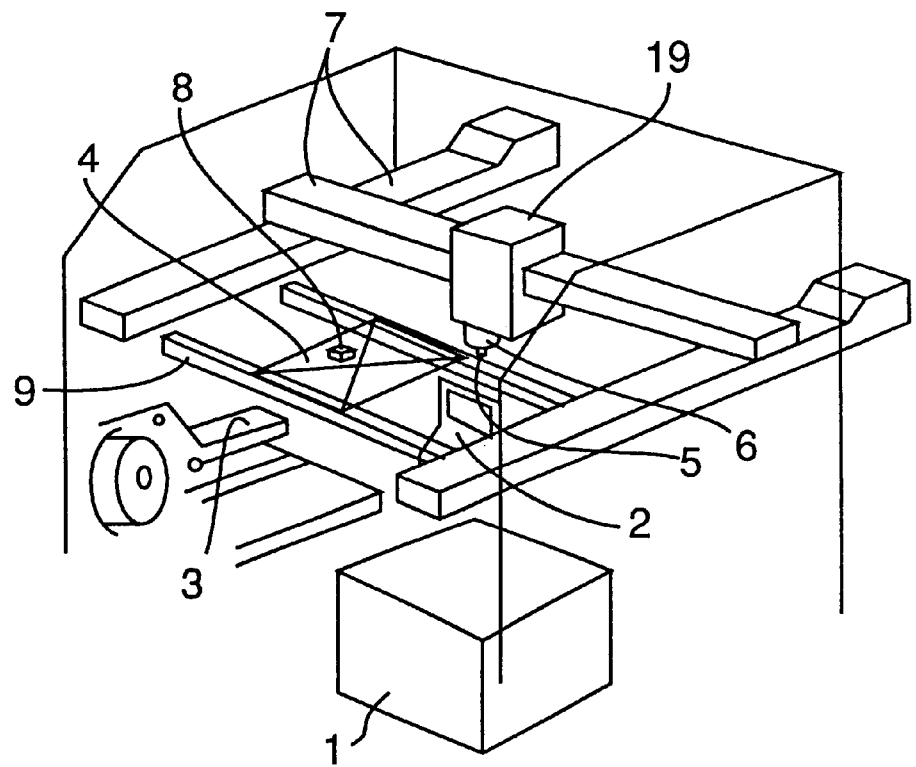

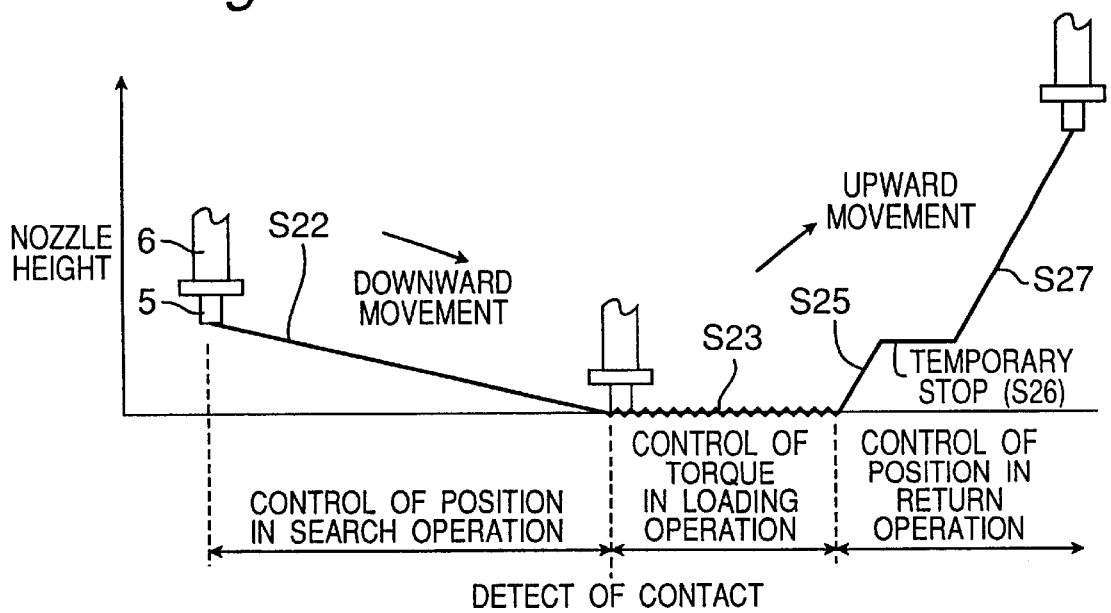

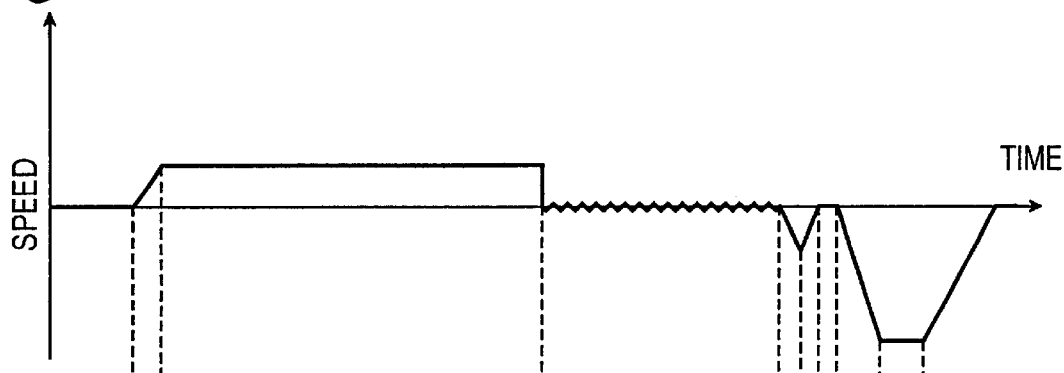
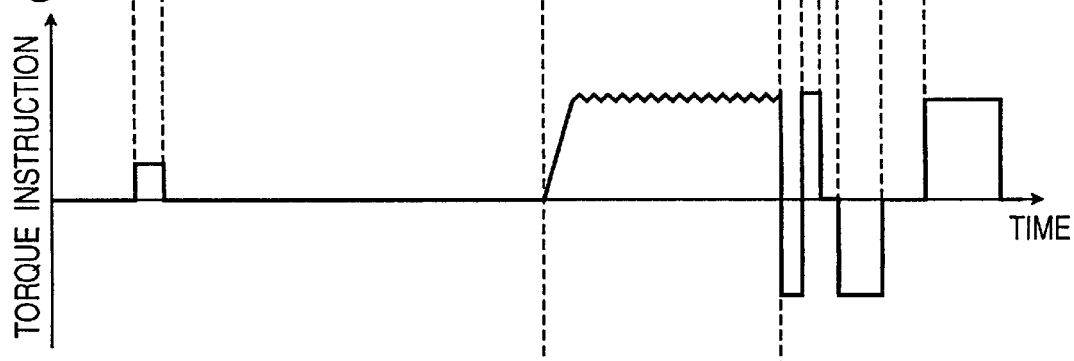

*Fig. 14A* PRIOR ART
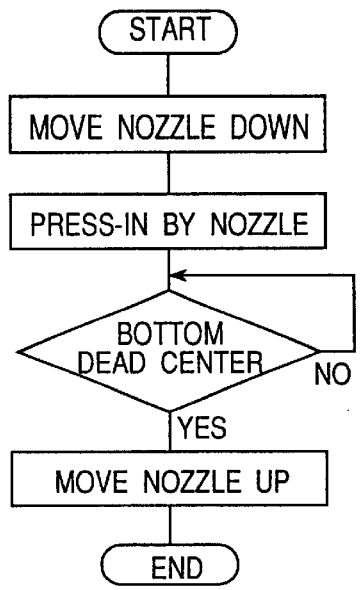
*Fig. 14B* PRIOR ART
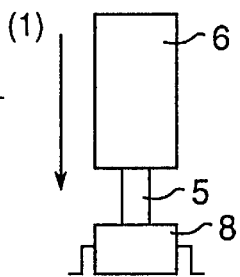
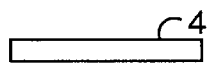
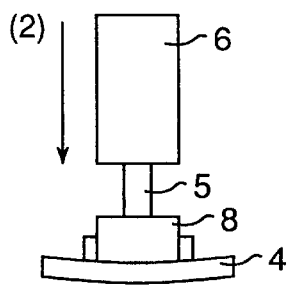
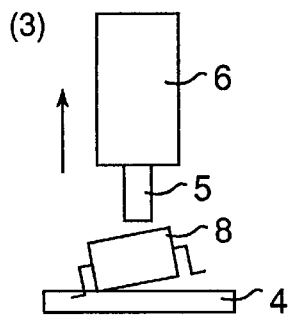
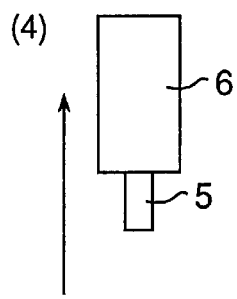
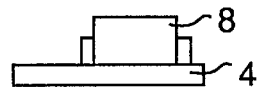

DEVICE AND METHOD FOR MOUNTING ELECTRONIC PARTS

TECHNICAL FIELD

The present invention relates to an apparatus and a method for mounting components such as electronic components, mechanism components, etc. onto members to be mounted, e.g., boards, etc.

BACKGROUND ART

A conventional mounting apparatus for electronic components of the above-referenced type will be described with reference to the drawings. FIG. 3 is a perspective view schematically showing an essential portion of a generally used mounting apparatus for electronic components. In the drawing, reference numerals respectively indicate: 1 a controller, 2 an operation panel, 3 a component feed cassette, 4 a board, 5 a nozzle, 6 a head part having the nozzle 5, 7 an XY robot, 8 an electronic component, 9 an XY table, and 19 a head part-supporting part for moving the head part 6 up and down and also moving in XY directions with the use of the XY robot 7. In the constitution of the conventional mounting apparatus, each part of the apparatus operates in a manner as follows. Specifically, the head part 6 having the nozzle 5 at the head part-supporting part 19 which is positioned by the XY robot 7 sucks the to-be-mounted electronic component 8 by the nozzle 5 from the component feed cassette 3, moves in the XY directions thereby carrying the component 8 sucked by the nozzle 5 to a mounting position, and lowers and mounts the component to a predetermined position of the board 4 securely held at the XY table 9. At the time of lowering the electronic component 8, a descent distance is set to a value obtained by subtracting a thickness of the electronic component 8 from a reference descent stroke and adding a push-in amount of a constant value to the resulting value. After a preliminarily set time has passed with the head part 6 completely descending, i.e., at a bottom dead center of the nozzle, the nozzle 5 rises to a regulated height, whereby one mounting cycle is finished. The cycle is repeated thereafter. Data of the aforementioned descent stroke and push-in amount are input from the operation panel 2 and controlled by the controller 1.

The above operation will be more fully described with reference to a flow chart of FIG. 14A. In FIG. 14A, a state at a descent step of the nozzle after the apparatus starts is as illustrated in (1) of FIG. 14B, followed sequentially by a push-in step in FIG. 14B(2) and a nozzle ascent step shown in FIGS. 14B(3) to 14B(4).

In the mounting apparatus of the prior art, since the push-in amount to mount the component is constant (fixed), irregularities in height of the electronic components and irregularities in mounting height of the electronic components because of a rising or swelling solder cannot be coped with. That is, the component might be pressed too much onto the board when the component is mounted on the board, and leap up due to an elasticity of the board when the nozzle rises afterwards, as is clear from FIG. 14B(3). The component 8 would eventually be displaced as shown in FIG. 14B(4), or the like inconvenience of deteriorating accuracy of the component after mounting is brought about.

The present invention is devised to eliminate the above-described issue, and has for its object to provide an apparatus and a method for mounting components which can prevent displacement of the components after mounting and improve productivity.

DISCLOSURE OF INVENTION

In order to accomplish this and other objects, the present invention is constructed as follows. According to a first aspect of the present invention, there is provided a mounting apparatus for a component, which comprises:

a component holding member for holding a component and moving up and down relative to a mounting member on which the component is to be mounted;

a driving apparatus for moving the component holding member up and down; and a control apparatus controlling the driving apparatus so that the component holding member holding the component moves down towards the mounting member, brings the held component into contact with the mounting member, moves further downward by a push-in amount, mounts the component to the member, moves up by a distance corresponding approximately to the push-in amount, stops temporarily thereby retaining the component, maintains a retaining state for a fixed time, and then moves up again.

According to a second aspect of the present invention, there is provided a component mounting apparatus according to the first aspect wherein the control apparatus receives an input of warp state information indicating a state of warp of the mounting member, and determines on the basis of the input information indicating the state of warp the push-in amount by the component holding member when mounting the component to the mounting member, so that the component is mounted on the basis of the determined push-in amount.

According to a third aspect of the present invention, there is provided a component mounting apparatus according to the first or second aspect, wherein the control apparatus receives an input of information of the push-in amount for every component, and determines on the basis of the input information of the push-in amount of the component the push-in amount by the component holding member when mounting the component to the mounting member, so that the component is mounted on the basis of the determined push-in amount.

According to a fourth aspect of the present invention, there is provided a component mounting apparatus according to any one of the first through third aspects, wherein the control apparatus receives an input of information of the push-in amount of the component based on information of a mounting position of the component relative to the mounting member, and determines on the basis of the input information of the push-in amount of the component the push-in amount by the component holding member when mounting the component to the mounting member, so that the component is mounted on the basis of the determined push-in amount.

According to a fifth aspect of the present invention, there is provided a component mounting apparatus according to any one of the first through fourth aspects, which further comprises a load detection apparatus for detecting a load acting on the component holding member or the mounting member when the component is mounted to the mounting member by the component holding member, whereby the control apparatus controls the component holding member to press in the component to the mounting member until the push-in amount obtained from the load detected by the load detection apparatus becomes a predetermined push-in amount.

According to a sixth aspect of the present invention, there is provided a component mounting apparatus according to any one of the first through fifth aspects, wherein the fixed time while the nozzle maintains the retaining state under the control by the control apparatus is a time provided for preventing the component from leaping.

According to a seventh aspect of the present invention, there is provided a component mounting apparatus according to any one of the first through sixth aspects, wherein the control apparatus controls so that the component holding member moves up at a low speed enabling prevention of a leap of the component for only a period enabling the prevention of the leap of the component, and moves up at a speed higher than the low speed after the period, in place of the arrangement that the component holding member is raised by a distance corresponding approximately to the push-in amount, temporarily stopped thereby retaining the component, maintains a retaining state for the fixed time, and rises again.

According to an eighth aspect of the present invention, there is provided a component mounting method which comprises: moving down a component holding member holding a component towards a mounting member on which the component is to be mounted;

bringing the held component in contact with the mounting member, and then lowering the component further by a push-in amount thereby mounting the component to the mounting member;

thereafter raising the component holding member by a distance corresponding approximately to the push-in amount of the component holding member, and then stopping the component holding member temporarily thereby retaining the component; and raising the component holding member again a fixed time later (after a lapse of a fixed time) in a state wherein the component is retained by the component holding member.

According to a ninth aspect of the present invention, there is provided a component mounting method according to the eighth aspect, wherein the push-in amount by the component holding member when mounting the component to the mounting member is determined on the basis of information of a state of warp of the mounting member before the component is mounted, so that the component is mounted on the basis of the determined push-in amount.

According to a 10th aspect of the present invention, there is provided a component mounting method of the eighth or ninth aspect, wherein the push-in amount by the component holding member when mounting the component to the mounting member is determined on the basis of information of a push-in amount for every component, so that the component is mounted on the basis of the determined push-in amount.

According to an 11th aspect of the present invention, there is provided a component mounting method according to any one of the eighth through 10th aspects, wherein the push-in amount by the component holding member when mounting the component to the mounting member is determined on the basis of information of the push-in amount of the component which is based on information of a mounting position of the component relative to the mounting member, so that the component is mounted on the basis of the determined push-in amount.

According to a 12th aspect of the present invention, there is provided a component mounting method according to any one of the eighth through 11th aspects, wherein a load acting on the component holding member or the mounting member is detected at the time when the component is mounted to the member by the component holding member, thereby controlling so that the component is pressed in by the component holding member to the mounting member until the push-in amount obtained from the detected load becomes a predetermined press-in amount.

According to a 13th aspect of the present invention, there is provided a component mounting method according to any one of the eighth through 12th aspects, wherein the fixed time while the nozzle retains the component is a time provided for preventing the component from leaping.

According to a 14th aspect of the present invention, there is provided a component mounting method according to any one of the eighth through 13th aspects, wherein the component holding member is adapted to be raised at a low speed enabling prevention of a leap of the component for only a period enabling the prevention of the leap of the component, and raised at a speed higher than the low speed after the period, in place of the arrangement whereby the component holding member is raised by a distance corresponding approximately to the push-in amount, temporarily stopped thereby retaining the component, maintains the retaining state for a fixed time, and rises again.

According to the present invention as above, the components after mounting are prevented from being displaced and productivity is improved.

BRIEF DESCRIPTION OF DRAWINGS

These and other aspects and features of the present invention will become clear from the following description taken in conjunction with the preferred embodiments thereof with reference to the accompanying drawings, in which:

FIG. 2 is a diagram explanatory of a descent stroke of a nozzle in the electronic component mounting apparatus of the above embodiment of the present invention;

FIG. 3 is a perspective view schematically showing the constitution of a generally used electronic component mounting apparatus;

FIG. 6 is a diagram of a relationship between a position and each operation in an up-down movement of the nozzle of the electronic component mounting apparatus of the embodiment;

FIG. 7 is a diagram of a relationship between speed and time of the up-down movement of the nozzle of FIG. 6;

FIG. 8 is a diagram of a relationship of torque instruction values and the time of the nozzle of FIG. 6;

FIG. 9 is a diagram of a relationship of actual loads and the time of the nozzle of FIG. 6;

FIG. 14A is a flow chart explanatory of the operation of the conventional electronic component mounting apparatus;

FIG. 14B is a diagram showing sequential operations at respective steps of FIG. 14A.

DETAILED DESCRIPTION OF THE INVENTION

Figure 1A:
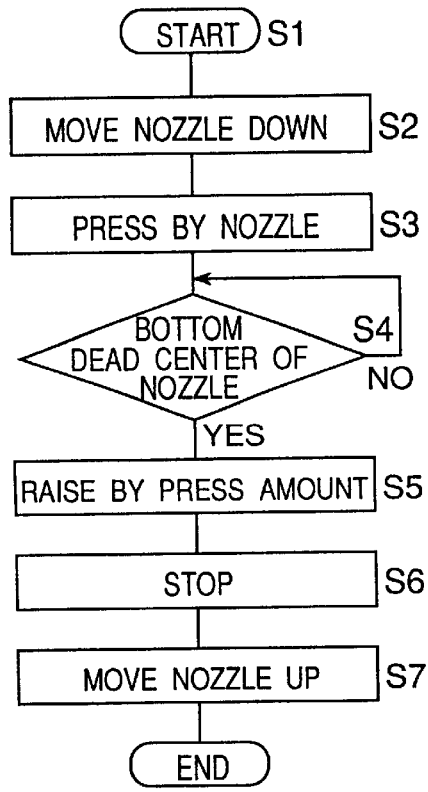
FIGS. 1A and 1B are a flow chart and an explanatory diagram for explaining the operation of a mounting method for electronic components in an electronic component mounting apparatus according to an embodiment of the present invention.

Before the description of the present invention proceeds, it is to be noted that like parts are designated by like reference numerals throughout the accompanying drawings.

Hereinbelow an embodiment of the present invention will be discussed with reference to the drawings. The fundamental constitution of an electronic component mounting apparatus in the embodiment of the present invention is equal to that indicated in FIG. 3, and therefore will be depicted with reference to this FIG. 3 as well as a flow chart of FIG. 1A and an explanatory diagram of a descent stroke of a nozzle of FIG. 2. Since the constitution of FIG. 3 is as described earlier, the detailed explanation thereof will be omitted here.

In the present embodiment in the constitution of FIG. 3, each part of the apparatus operates in the following manner. A head part 6 having a nozzle 5 as an example of a component holding member which is positioned by an XY robot 7 sucks an electronic component 8 as an example of a component to be mounted from a component feed cassette 3 to the nozzle 5. The head part 6 moves in XY directions thereby carrying the component 8 to a mounting position, moves the nozzle 5 down by a predetermined stroke to a predetermined position of a board 4 as an example of a member to be mounted which is fixed at an XY table 9, and mounts the component.

Figure 4:
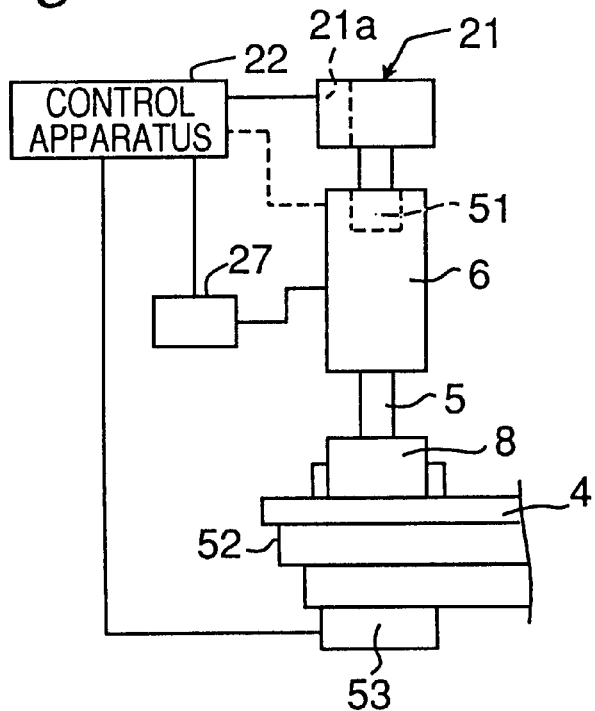
FIG. 4 is a diagram of the nozzle and driving and controlling parts therefor of the electronic component mounting apparatus of the embodiment.

As shown in FIG. 4, the nozzle 5 according to the embodiment is vacuum-sucked by an evacuating apparatus 27 and can suck and hold the component 8 at a lower end thereof. The head part 6 having the nozzle 5 can move up and down through forward and rearward driving of a motor 21. An air cylinder or the like known means is employable to operate in the same manner as the motor 21. The driving of the motor 21 and evacuating apparatus 27 is controlled by a control apparatus 22.

Figure 5:
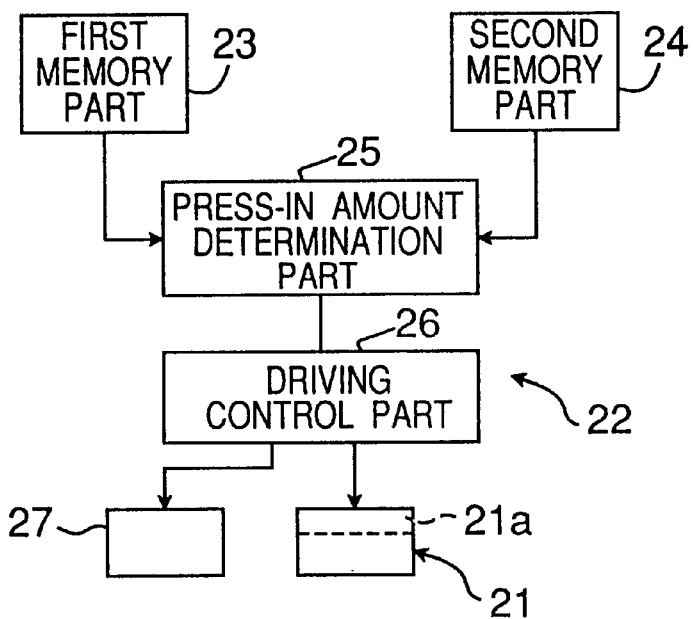
FIG. 5 is a block diagram of the constitution of a control apparatus of the electronic component mounting apparatus of the embodiment.

The control apparatus 22 comprises, as indicated in FIG. 5, a first memory part 23, a second memory part 24, a push-in amount determination part 25, and a driving control part 26.

The first memory part 23 stores beforehand information of general push-in amounts for components 8 designated by component numbers, information of thicknesses of components 8, information of a special push-in amount used in the case where a specific component 8 is required to be pressed in by the special push-in amount different from the general push-in amount, etc. This information can be manually input by an operator through an operation panel of the electronic component mounting apparatus or read out and stored from a recording medium such as a CD-ROM, etc. or stored by a communications means, etc.

The second memory part 24 stores information related to a mounting process in the form of an NC program or the like. The information includes a mounting position (an X-directional coordinate, a Y-directional coordinate, a rotational angle θ about a Z axis) for every component 8 (designated by the component number) with respect to the board 4, a mounting order of components 8, push-in amounts to the mounting positions, etc. The aforementioned push-in amount to the mounting position is a press-in amount for correcting the press-in amount by increasing the press-in amount at the central part of the board relative to an end part thereof because the warp of the central part is excessively large as compared with that of the end part, for example, in the case of a large board exceeding a predetermined size. The push-in amount is obtained by changing a correction push-in amount for every mounting position of the board 4 or changing the correction push-in amount for every area where the board is present. The mounting information as above can be manually input by the operator through the operation panel, read out and stored from a recording medium such as a CD-ROM or the like, or stored by a communications means, etc., similar to the first memory part 23.

The push-in amount determination part 25 takes out the component number of the component 8 to be mounted next from the mounting information obtained from the second memory part 24, reads the information of the push-in amount for the component 8 corresponding to the component number from the first memory part 23, subtracts a thickness of the electronic component 8 from a reference descent stroke of the nozzle 5, and determines a resultant value as the push-in amount for the component 8. The reference descent stroke is stored in the first memory part 23, and is a stroke by which the nozzle 5 in a state without sucking the component 8 is lowered thereby pressing in the board 4 only by a required amount (e.g., 0.2–0.3 mm). That is, the board 4 can be pressed in by the required press-in amount by lowering the nozzle 5 by a distance obtained by subtracting the thickness of the component 8 from the reference descent stroke. However, in the case of the specific component 8 which needs not smaller than the required push-in amount, the thickness of the specific electronic component 8 is subtracted from the reference descent stroke of the nozzle 5, and then, the push-in amount for the specific component 8 is added, thereby obtaining a push-in amount. If the board 4 is so large that the board 4 exceeds the predetermined size and the correction push-in amount at the mounting position as stored in the second memory part 24, the correction push-in amount is added further to the above-operated push-in amount, which is determined as the push-in amount. The correction push-in amount is not necessary to add if the board is not larger than the predetermined size.

The driving control part 26 controls the driving of the motor 21 on the basis of the push-in amount determined by the push-in amount determination part 23 to lower the head part 6 thereby pressing in the component 8 to the board 4.

On the other hand, the driving control part 26 controls the driving of the motor 21 based on the press-in amount determined by the press-in amount determination part 23 as follows. That is, while raising the nozzle 5, namely, head part 6, the driving control part 26 temporarily stops the upward movement of the nozzle 5 after raising the nozzle 5 by an amount nearly corresponding to the push-in amount, and raises the nozzle 5 again after a leap control time for the component 8 has passed.

The operation at this time will be depicted with reference to the flow chart of FIG. 1A.

Figure 1B:
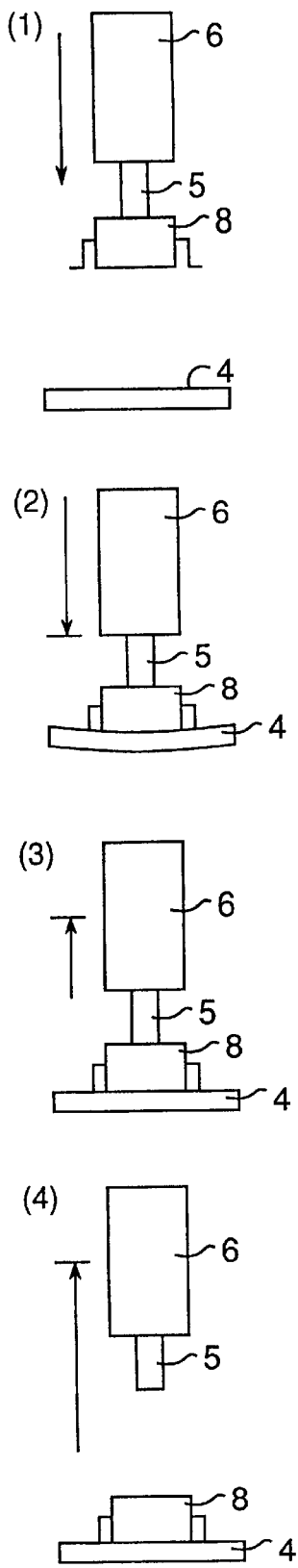

In FIG. 1A, the mounting apparatus starts in step S1 which is followed by step S2 of moving down the nozzle. The nozzle-moving-down state is specifically indicated in (1) in FIG. 1B. Succeeding step S3 of pressing in by the nozzle is represented in (2) of FIG. 1B. The descent stroke is in principle a value obtained by subtracting the thickness of the component 8 from the reference descent stroke, as operated at the control apparatus 22. A method different than the above may be adopted for operating the descent stroke, whereby a thickness $L_2$ of the electronic component 8 is subtracted from a reference descent amount $L_1$ and a push-in amount $L_3$ is added thereto as shown in FIG. 2. In step S4, the nozzle 5 is stopped for a preliminarily set time at a nozzle bottom dead center where the head part 6 is completely moved down, so that the electronic component 8 is mounted. In the next step S5, the nozzle 5 is raised by a distance approximately corresponding to the push-in amount $L_3$. The nozzle 5 is stopped for a predetermined time in step S6 in a state as shown in (3) of FIG. 1B, while holding and retaining the electronic component 8. Adverse influences of a leap of the electronic component 8 are thus avoided. After the predetermined time has passed in the state, the nozzle 5 is raised to a regulated upward height position in step S7 as shown in (4) of FIG. 1B. One mounting cycle is completed in this way. The cycle is repeatedly carried out, whereby the electronic components 8 are continuously mounted.

The leap of the component 8 may be caused by an elasticity of the component body itself. That is, the component 8 when held between the nozzle 5 and the board 4 reacts because of the elasticity and thus leaps or bounces up at the rise of the nozzle 5. Another reason for the leap is lead parts projecting from the component 8 into contact with the board 4. Since the lead parts are compressed at the time of mounting the component 8, the lead parts also react and leap. Further, an upward warp of the board 4 can cause the board 4 to bounce after the component 8 is mounted, which invites the leap of the component 8 sitting on the board 4. In order to cope with various types of the leap of the component 8, in the step S6 of stopping the nozzle 5, it is necessary that a stop position of the nozzle after being raised can be changed for every component 8, a rise and stop position of the nozzle can be changed for every mounting position at the board 4, a stop period of time can be made variable because of a difference in resonance of the leaps of the component 8 and the board 4, etc. In other words, when the nozzle 5 rises, the nozzle 5 is controlled not to be raised all at once, but the nozzle 5 is stopped temporarily when the nozzle 5 rises by nearly the distance corresponding to the push-in amount for the component 8 (referring to step S6 of FIG. 1A and (3) of FIG. 1B). In this state, the board 4 is consequently turned flat without the pressing-in based on the press-in amount, and the resonance by the component 8 and the board 4 can be restricted in this state. The nozzle 5 is raised again after the resonance is suppressed sufficiently (with reference to step S7 of FIG. 1A and (4) of FIG. 1B).

Figure 12:
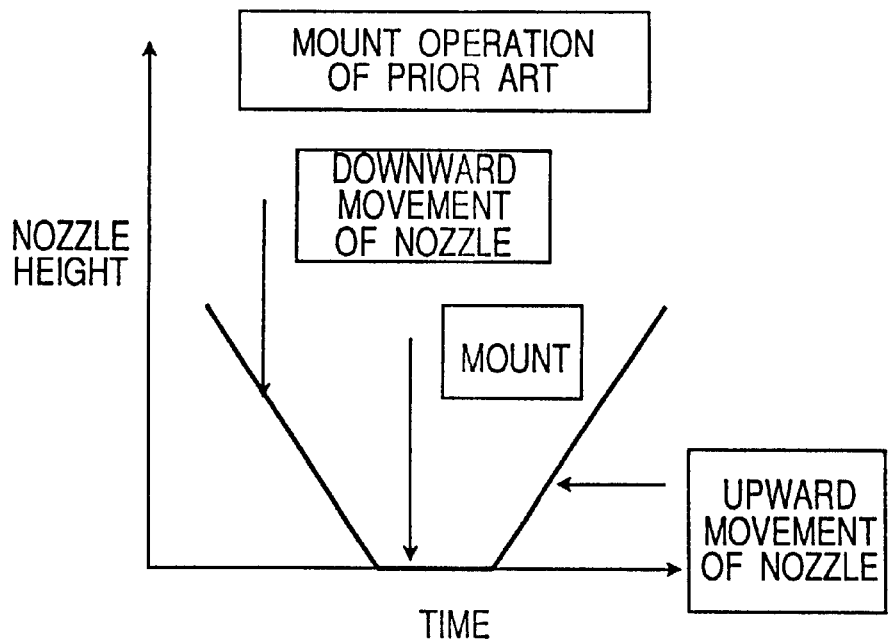
FIG. 12 is a diagram of a relationship between operations and time of a nozzle of a conventional electronic component mounting apparatus.
Figure 13:
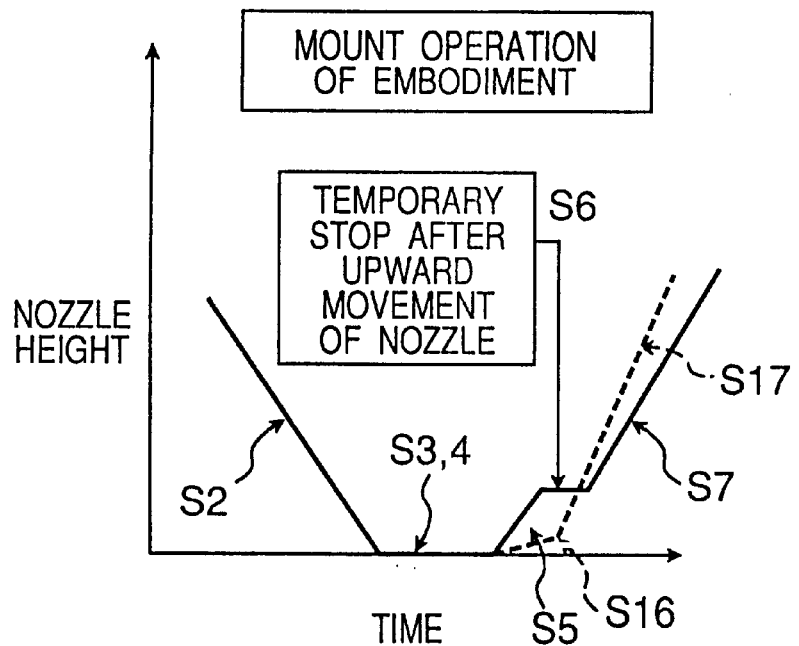
FIG. 13 is a diagram of a relationship of operations and time of the nozzle of the electronic component mounting apparatus of the embodiment.

For comparison, FIG. 12 shows a relationship of heights of the nozzle and time when the nozzle is lowered, when the component is mounted, when the nozzle is raised, in the conventional electronic component mounting apparatus. FIG. 13 shows a relationship of the heights of the nozzle and the time when the nozzle is lowered, when the component is mounted, when the nozzle is raised, when the nozzle is temporarily stopped after being raised, and when the nozzle is raised, in the electronic component mounting apparatus of the embodiment. S2–S7 in FIG. 13 correspond to steps S2–S7 in FIG. 1A.

The above-discussed reference descent stroke, thickness of the component 8, correction push-in amount, reference descent amount $L_1$, component thickness $L_2$, push-in amount $L_3$, and stop period of time of the nozzle 5 after being raised by the distance nearly corresponding to the push-in amount $L_3$, etc. can be set optionally. For instance, the values can be set to fit for each component easy to leap, e.g., TSOP (Thin Small Outline Package). Besides, if the above rise amount, descent amount, and stop period of time, etc. are set at every numerical control (referred to as "NC" hereafter) in the electronic component mounting apparatus subjected to NC, influences because of irregularities in characteristics of boards (e.g., material, size of boards, whether the board is multilayer or single-layer, etc.) can be handled for every NC, thereby enabling optimum mounting.

According to the present embodiment, the nozzle 5 is raised by the distance almost corresponding to the push-in amount after pressing in the component 8 by the push-in amount when the component 8 is mounted by the nozzle 5, and then stopped temporarily. The resonance brought about by the component 8 and the board 4 can be surely restricted, and consequently the component 8 can be prevented from leaping. A misregistration in mounting due to the leap of the component 8 can be thus controlled, and at the same time influences of the characteristics of the board 4 and of nonuniformity of components 8 can be avoided without using a pressure sensor or the like hardware.

Figure 15:
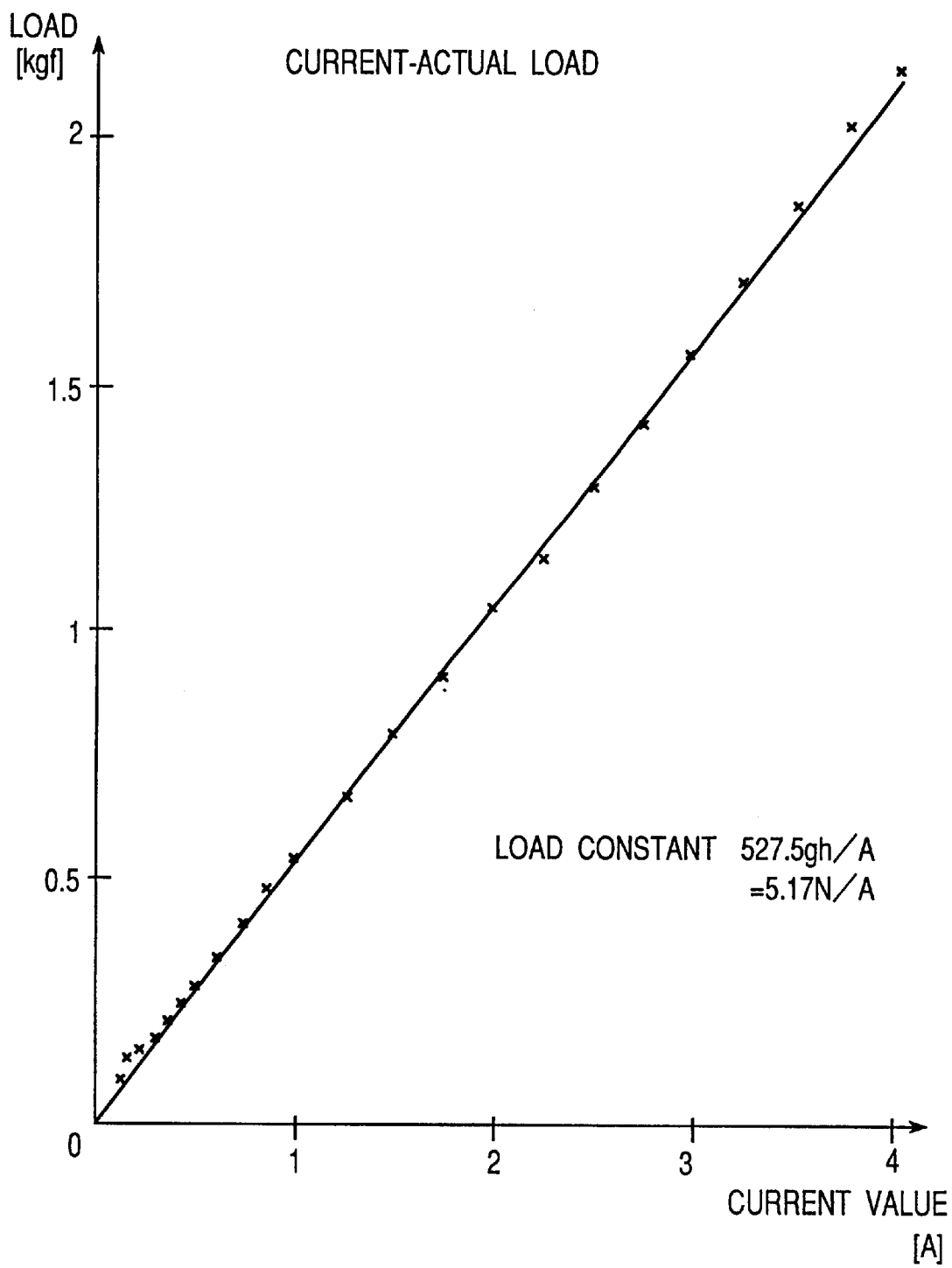
FIG. 15 is a diagram of a relationship of a load applied by the nozzle when pressing in and a current value by an ammeter in the embodiment.

In the foregoing embodiment, when the nozzle 5 is temporarily stopped after being raised, the nozzle 5 is temporarily stopped after being raised by the push-in amount. However, the present invention is not limited to the embodiment. For example, in an apparatus and a method for mounting electronic components according to a different embodiment of the present invention, as shown in FIG. 4, a load cell 51 is provided for a load detection apparatus for detecting a load acting on the nozzle 5, or a load cell 53 serving as a load detection apparatus for detecting a load acting on the board 4 is provided under a supporting member 52 supporting the board 4, whereby a mounting pressure to the component 8 to be mounted when the component 8 sucked by the nozzle 5 is mounted to the board 4 is controlled. In a case where the nozzle 5 rises, the upward movement of the nozzle 5 may be temporarily suspended when the load on the nozzle 5 or the board 4 becomes 0. Since a current value of the motor 21 for moving the nozzle 5 up and down is inversely proportional to a torque (force) of the motor 21, the force is controlled by controlling the current running in the motor 21. In the electronic component mounting apparatus, the relationship of force amounts and current values can be controlled as follows. A relationship of a load acting on the component 8 to be mounted and the current value is preliminarily detected with the use of a pressure sensor such as the load cell or the like measuring the force (load) acting on the nozzle 5, and formed in a graph as shown in FIG. 15, a table or an operation formula. The load on the component can be controlled by controlling the current value supplied to the motor 21 when the motor 21 is driven by a motor driver 21a which is incorporated in the motor 21 in the drawing. For example, it is understood from FIG. 15 that the load of 0.5 Kgf can act thereon when the current of approximately 1A is fed to the motor 21.

The operation of controlling the load at the time of mounting the electronic component will be specifically described. In a step (S22 in FIG. 6) corresponding to step S2 of FIG. 1A, when the nozzle 5 is being moved down, a contact search is carried out; that is, it is detected that the component 8 is brought in contact with the board 4. Then, in a step (S23 in FIG. 6) corresponding to step S3 of FIG. 1A, the load acting on the nozzle 5 or the board 4 is detected by the load cell 51 or 53 while a constant load is applied to the component 8 through the downward movement of the nozzle 5. According to this operation, the component is pressed until the load approximately corresponding to the predetermined push-in amount determined by the control apparatus 22 is detected. After the component is pressed in by the predetermined push-in amount, in a step (S25 in FIG. 6) corresponding to step S5 of FIG. 1A, the nozzle 5 is raised until the predetermined push-in amount becomes 0 or approximately 0 in the former embodiment, and stopped thereafter temporarily (step S6 in FIG. 1A). In contrast, according to the instant embodiment, the point in time when the load acting on the nozzle 5 or the board 4 is 0 or approximately 0 is detected from a signal input from the load cell 51 or 53 to the control apparatus 22, and the upward movement of the nozzle 5 is stopped at this time by the control apparatus 22 (S26 in FIG. 6). The nozzle 5 is temporarily stopped and then the predetermined time is elapsed, the nozzle 5 is raised again (S27 in FIG. 6), which is equal to step S7 in FIG. 1A of the earlier embodiment. For each operation, a relationship of movement speeds and time of the nozzle 5, a relationship of the current values (torque instruction) fed to the motor 21 and the time, and a relationship of actual loads and the time are respectively represented in FIGS. 7, 8, and 9.

Figure 10:
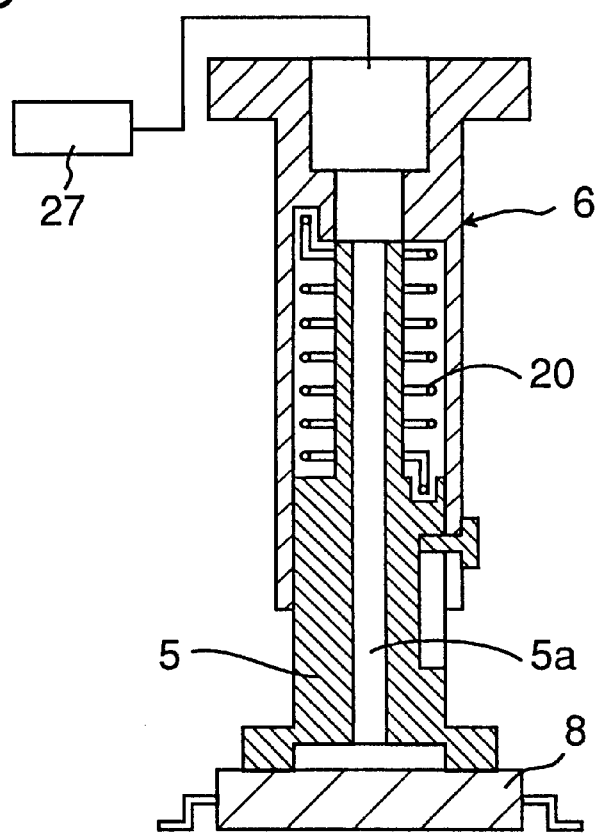
FIG. 10 is a longitudinal sectional view of the nozzle of the electronic component mounting apparatus of the embodiment.

In each of the above embodiments, a coil spring 20 is fitted at the nozzle 5 in the head part 6 or at an upper end part of a regulating member 54 as shown in FIG. 10. The nozzle 5 or the regulating member 54 is normally kept urged by an urging force of the coil spring 20 to a lower end position with respect to the head part 6. After the component 8 is sucked to the lower end of the nozzle 5 via a suction path 35a of the nozzle 5 connected to the evacuating apparatus 27 or is caught by a chuck 31, and if an overload acts on the component 8 when the component 8 is pressed in to the board 4, the coil spring 20 is compressed, thereby preventing the component 8 from being broken.

Figure 11:
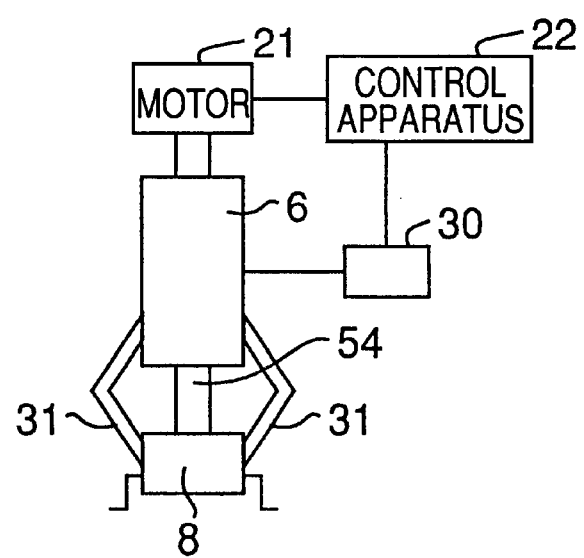
FIG. 11 is a diagram of a modified example of the nozzle of the electronic component mounting apparatus of the embodiment.

The component holding member for holding the component 8 is not restricted to the nozzle 5 applying suction to the component. As shown in FIG. 11, a pair of chucks 31 may be employed to hold the component 8 through driving of a chuck driving apparatus 30 under the control by the control apparatus 22, and when the component 8 is pressed in, the regulating member 54 projecting downward of the head part 6 may be used to press in the component 8 to the board 4. The chuck driving apparatus 30 is controlled in operation by the control apparatus 22, similar to the evacuating apparatus 27 for the nozzle 5.

In the above-described embodiment, the nozzle 5 is stopped once while being raised. However, as shown by a chain line in FIG. 13, the nozzle 5 can be adapted to be raised at such a low speed that can prevent the leap of the component 8 only for a period when the leap of the component 8 is prevented (step S16), and then moved up at a speed higher than the low speed after the period (step S17). In this arrangement, the resonance of the component 8 or the board 4 can be restricted without stopping the nozzle 5 thereby preventing the component 8 from leaping up.

According to the present invention, a displacement of the component after mounting can be avoided on the occasion when the component is mounted. In other words, the present invention is advantageously effective to improve productivity. The entire disclosure of Japanese Patent Application No. 8-308058 filed on Nov. 19, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus which comprises:
   a component holding member for holding a component and moving up and down relative to a mounting member on which the component is to be mounted;
   a driving apparatus for moving the component holding member up and down; and
   a control apparatus controlling the driving apparatus so that the component holding member holding the component moves down towards the mounting member, brings the held component into contact with the mounting member, moves further downward by a push-in amount, mounts the component to the mounting member, moves up by a distance corresponding approximately to the push-in amount, stops temporarily thereby retaining the component, maintains a retaining state for a fixed time, and then moves up again.

2. The component mounting apparatus according to claim 1, wherein the control apparatus receives an input of warp state information indicating a state of warp of the mounting member, and determines the push-in amount based on the warp state information, so that the component is mounted based on the determined push-in amount.

3. The component mounting apparatus according to claim 2, wherein the control apparatus receives an input of information of the push-in amount for every component, and determines based on the input information of the push-in amount of the component the push-in amount by the component holding member when mounting the component to the mounting member, so that the component is mounted based on determined push-in amount.

4. The component mounting apparatus according to claim 2, wherein the control apparatus receives an input of information of the push-in amount of the component based on information of a mounting position of the component relative to the mounting member, and determines based on the input information of the push-in amount of the component the push-in amount by the component holding member when mounting the component to the mounting member, so that the component is mounted based on the determined push-in amount.

5. The component mounting apparatus according to claim 2, which further comprises a load detection apparatus for detecting a load acting on the component holding member or the mounting member when the component is mounted to the mounting member by the component holding member, whereby the control apparatus controls the component holding member to press in the component to the mounting member until the push-in amount obtained from the load detected by the load detection apparatus becomes a predetermined push-in amount.

6. The component mounting apparatus according to claim 2, wherein the fixed time that the nozzle maintains the retaining state under control of the control apparatus is a time provided for preventing the component from leaping.

7. The component mounting apparatus according to claim 1, wherein the control apparatus receives an input of information of the push-in amount for every component, and determines based on the input information of the push-in amount of the component the push-in amount by the component holding member when mounting the component to the mounting member, so that the component is mounted based on the determined push-in amount.

8. The component mounting apparatus according to claim 7, wherein the control apparatus receives the input of information of the push-in amount of the component based on information of a mounting position of the component relative to the mounting member, and determines based on the input information of the push-in amount of the component the push-in amount by the component holding member when mounting the component to the mounting member, so that the component is mounted based on the determined push-in amount.

9. The component mounting apparatus according to claim 7, which further comprises a load detection apparatus for detecting a load acting on the component holding member or the mounting member when the component is mounted to the mounting member by the component holding member, whereby the control apparatus controls the component holding member to press in the component to the mounting member until the push-in amount obtained from the load detected by the load detection apparatus becomes a predetermined push-in amount.

10. The component mounting apparatus according to claim 3, wherein the fixed time that the nozzle maintains the retaining state under control of the control apparatus is a time provided for preventing the component from leaping.

11. The component mounting apparatus according to claim 1, wherein the control apparatus receives an input of information of the push-in amount of the component based on information of a mounting position of the component relative to the mounting member, and determines based on the input information of the push-in amount of the component the push-in amount by the component holding member when mounting the component to the mounting member, so that the component is mounted based on the determined push-in amount.

12. The component mounting apparatus according to claim 4, which further comprises a load detection apparatus for detecting a load acting on the component holding member or the mounting member when the component is mounted to the mounting member by the component holding member, whereby the control apparatus controls the component holding member to press in the component to the mounting member until the push-in amount obtained from the load detected by the load detection apparatus becomes a predetermined push-in amount.

13. The component mounting apparatus according to claim 4, wherein the fixed time that the nozzle maintains the retaining state under control of the control apparatus is a time provided for preventing the component from leaping.

14. The component mounting apparatus according to claim 1, which further comprises a load detection apparatus for detecting a load acting on the component holding member or the mounting member when the component is mounted to the mounting member by the component holding member, whereby the control apparatus controls the component holding member to press in the component to the mounting member until the push-in amount obtained from the load detected by the load detection apparatus becomes a predetermined push-in amount.

15. The component mounting apparatus according to claim 5, wherein the fixed time that the nozzle maintains the retaining state under control of the control apparatus is a time provided for preventing the component from leaping.

16. The component mounting apparatus according to claim 1, wherein the fixed time that the nozzle maintains the retaining state under control of the control apparatus is a time provided for preventing the component from leaping.

17. A component mounting apparatus which comprises:
a component holding member for holding a component and moving up and down relative to a mounting member on which the component is to be mounted;
a driving apparatus for moving the component holding member up and down; and
a control apparatus controlling the driving apparatus so that the component holding member holding the component moves down towards the mounting member, brings the held component into contact with the mounting member, moves further downward by a push-in amount, mounts the component to the mounting member, moves up at a low speed enabling prevention of a leap of the component for only a period enabling the prevention of the leap of the component, and then moves up at a speed higher than said low speed after said period.

18. The component mounting apparatus according to claim 17, wherein the control apparatus receives an input of warp state information indicating a state of warp of the mounting member, and determines the push-in amount based on the warp state information, so that the component is mounted based on the determined push-in amount.

19. The component mounting apparatus according to claim 17, wherein the control apparatus receives an input of information of the push-in amount for every component, and determines based on the input information of the push-in amount of the component the push-in amount by the component holding member when mounting the component to the mounting member, so that the component is mounted based on the determined push-in amount.

20. The component mounting apparatus according to claim 17, wherein the control apparatus receives an input of information of the push-in amount of the component based on information of a mounting position of the component relative to the mounting member, and determines based on the input information of the push-in amount of the component the push-in amount by the component holding member when mounting the component to the mounting member, so that the component is mounted based on the determined push-in amount.

21. The component mounting apparatus according to claim 17, which further comprises a load detection apparatus for detecting a load acting on the component holding member or the mounting member when the component is mounted to the mounting member by the component holding member, whereby the control apparatus controls the component holding member to press in the component to the mounting member until the push-in amount obtained from the load detected by the load detection apparatus becomes a predetermined push-in amount.

22. A component mounting method which comprises:
moving down a component holding member holding a component towards a mounting member on which the component is to be mounted;
bringing the held component in contact with the mounting member, and then lowering the component further by a push-in amount thereby mounting the component to the mounting member;
thereafter raising the component holding member by a distance corresponding approximately to the push-in amount of the component holding member, and then stopping the component holding member temporarily thereby retaining the component; and
raising the component holding member again after a lapse of a fixed time in a state wherein the component is retained by the component holding member.

23. A component mounting method according to claim 22, wherein the push-in amount by the component holding member when mounting the component to the mounting member is determined based on information of a state of a warp of the mounting member before the component is mounted, so that the component is mounted based on the determined push-in amount.

24. The component mounting method according to claim 23, wherein the push-in amount by the component holding member when mounting the component to the mounting member is determined based on information of a push-in amount for every component, so that the component is mounted based on the determined push-in amount.

25. The component mounting method according to claim 23, wherein the push-in amount by the component holding member when mounting the component to the mounting member is determined based on information of the push-in amount of the component which is based on information of a mounting position of the component to the mounting member, so that the component is mounted based on the determined push-in amount.

26. The component mounting method according to claim 23, wherein a load acting on the component holding member or the mounting member is detected at a time when the component is mounted to the mounting member by the component holding member, thereby controlling so that the component is pressed in by the component holding member to the mounting member until the push-in amount obtained from the detected load becomes a predetermined press-in amount.

27. The component mounting method according to claim 23, wherein the fixed time while the nozzle retains the component is a time provided for preventing the component from leaping.

28. The component mounting method according to claim 22, wherein the push-in amount by the component holding member when mounting the component to the mounting member is determined based on information of a push-in amount for every component, so that the component is mounted based on the determined push-in amount.

29. The component mounting method according to claim 28, wherein the push-in amount by the component holding member when mounting the component to the mounting member is determined based on information of the push-in amount of the component which is based on information of a mounting position of the component to the mounting member, so that the component is mounted based on the determined push-in amount.

30. The component mounting method according to claim 28 wherein a load acting on the component holding member or the mounting member is detected at a time when the component is mounted to the mounting member by the component holding member, thereby controlling so that the component is pressed in by the component holding member to the mounting member until the push-in amount obtained from the detected load becomes a predetermined press-in amount.

31. The component mounting method according to claim 28, wherein the fixed time while the nozzle retains the component is a time provided for preventing the component from leaping.

32. The component mounting method according to claim 22, wherein the push-in amount by the component holding member when mounting the component to the mounting member is determined based on information of the push-in amount of the component which is based on information of a mounting position of the component to the mounting member, so that the component is mounted based on the determined push-in amount.

33. The component mounting method according to claim 28 wherein a load acting on the component holding member or the mounting member is detected at a time when the component is mounted to the mounting member by the component holding member, thereby controlling so that the component is pressed in by the component holding member to the mounting member until the push-in amount obtained from the detected load becomes a predetermined press-in amount.

34. The component mounting method according to claim 32, wherein the fixed time while the nozzle retains the component is a time provided for preventing the component from leaping.

35. The component mounting method according to claim 22, wherein a load acting on the component holding member or the mounting member is detected at a time when the component is mounted to the mounting member by the component holding member, thereby controlling so that the component is pressed in by the component holding member to the mounting member until the push-pin amount obtained from the detected load becomes a predetermined press-in amount.

36. The component mounting method according to claim 35, wherein the fixed time while the nozzle retains the component is a time provided for preventing the component from leaping.

37. The component mounting method according to claim 22, wherein the fixed time while the nozzle retains the component is a time provided for preventing the component from leaping.

38. A component mounting method which comprises:

moving down a component holding member holding a component towards a mounting member on which the component is to be mounted;

bringing the held component in contact with the mounting member, and then lowering the component further by a push-in amount thereby mounting the component to the mounting member;

thereafter raising the component holding member at a low speed enabling prevention of a leap of the component for only a period enabling the prevention of the leap of the component; and raising the component holding member at a speed higher than said low speed after said period.

39. A component mounting method according to claim 38 wherein the push-in amount by the component holding member when mounting the component to the mounting member is determined based on information of a state of a warp of the mounting member before the component is mounted, so that the component is mounted based on the determined push-in amount.

40. The component mounting method according to claim 38 wherein the push-in amount by the component holding member when mounting the component to the mounting member is determined based on information of a push-in amount for every component, so that the component is mounted based on the determined push-in amount.

41. The component mounting method according to claim 38 wherein the push-in amount by the component holding member when mounting the component to the mounting member is determined based on information of the push-in amount of the component which is based on information of a mounting position of the component to the mounting member, so that the component is mounted based on the determined push-in amount.

42. The component mounting method according to claim 38 wherein a load acting on the component holding member or the mounting member is detected at a time when the component is mounted to the mounting member by the component holding member, thereby controlling so that the component is pressed in by the component holding member to the mounting member until the push-in amount obtained from the detected load becomes a predetermined press-in amount.

* * * * *